United States Patent
Zhang

(10) Patent No.: US 7,000,208 B2
(45) Date of Patent: Feb. 14, 2006

(54) REPETITION RECOGNITION USING SEGMENTS

(75) Inventor: Youping Zhang, Newark, CA (US)

(73) Assignee: Synopsys, Inc., Mountain View, CA (US)

( * ) Notice: Subject to any disclaimer, the term of this patent is extended or adjusted under 35 U.S.C. 154(b) by 220 days.

(21) Appl. No.: 10/208,891

(22) Filed: Jul. 29, 2002

(65) Prior Publication Data

US 2004/0019869 A1 Jan. 29, 2004

(51) Int. Cl.
*G06F 17/50* (2006.01)

(52) U.S. Cl. .............................. 716/11; 716/19; 716/20; 716/21

(58) Field of Classification Search .................. 716/11, 716/19–21, 10; 351/176; 250/311; 355/40
See application file for complete search history.

(56) References Cited

U.S. PATENT DOCUMENTS

| | | | |
|---|---|---|---|
| 5,631,110 A | 5/1997 | Shioiri et al. ................... 430/5 |
| 5,682,323 A | 10/1997 | Pasch et al. ................. 364/491 |
| 5,723,233 A | 3/1998 | Garza et al. .................... 430/5 |
| 5,815,685 A | 9/1998 | Kamon ........................ 395/500 |
| 5,825,647 A | 10/1998 | Tsudaka ................ 364/167.03 |
| 5,991,006 A | 11/1999 | Tsudaka ....................... 355/53 |
| 6,014,456 A | 1/2000 | Tsudaka ...................... 382/144 |
| 6,081,658 A | 6/2000 | Rieger et al. .......... 395/500.22 |
| 6,154,563 A | 11/2000 | Tsudaka ...................... 382/144 |
| 6,243,855 B1 | 6/2001 | Kobayashi et al. ........... 716/19 |
| 6,249,597 B1 | 6/2001 | Tsudaka ...................... 382/144 |
| 6,289,499 B1 | 9/2001 | Rieger et al. ................. 716/21 |
| 6,298,473 B1 | 10/2001 | Ono et al. ..................... 716/21 |
| 6,453,457 B1 | 9/2002 | Pierrat et al. ................. 716/19 |
| 6,795,955 B1 * | 9/2004 | MacLean et al. ............. 716/10 |
| 2002/0100004 A1 | 7/2002 | Pierrat et al. .................. 716/5 |
| 2002/0148961 A1 * | 10/2002 | Nakasuji et al. ............ 250/311 |
| 2003/0103189 A1 * | 6/2003 | Neureuther et al. ........ 351/176 |
| 2004/0019872 A1 * | 1/2004 | Lippincott et al. ............ 716/21 |

FOREIGN PATENT DOCUMENTS

| | | |
|---|---|---|
| GB | 2.324169 A | 10/1998 |
| JP | 3-80525 | 4/1991 |
| WO | WO 00/67074 A1 | 11/2000 |

OTHER PUBLICATIONS

Ackmann, P., et al., "Phase Shifting and Optical Proximity Corrections to Improve CD Control on Logic Devices in Manufacturing for Sub 0.35 $\mu$m I-Line", SPIE, vol. 3051, pp. 146–153, Mar. 12–14, 1997.

Lithas, "Lithas: Optical Proximity Correction Software" (2 pages).

(Continued)

*Primary Examiner*—Thuan Do
(74) *Attorney, Agent, or Firm*—Bever, Hoffman & Harms, LLP; Jeanette S. Harms

(57) ABSTRACT

Processing a chip layout (e.g. optical proximity correction (OPC) or verification) can be time consuming and require the use of expensive tools. Organizing the original layout using segments can minimize both of these resources. For example, shapes within a unit can be dissected into segments. Each segment can be compared to segments stored in a database. If the segment matches a listed segment, then the segment can be linked to the listed segment. Matching can be done by identifying corners within a neighborhood of each segment. If the segment and its neighborhood do not match those of a listed segment, then a new database entry can be created. Only representative segments are used to perform processing, thereby significantly improving resource allocation. The results from the representative segments can be copied to their respective linked segments, thereby ensuring accuracy of the processing.

32 Claims, 11 Drawing Sheets

OTHER PUBLICATIONS

Precim, "Proxima System", Precim Company, Portland, Oregon (2 pages).

Precim, "Proxima Wafer Proximity Correction System", Precim Company, Portland, Oregon (2 pages).

Rieger, M., et al., "Mask Fabrication Rules for Proximity-Corrected Patterns", Precim Company, Portland, Oregon (10 pages).

Rieger, M., et al., "Using Behavior Modeling for Proximity Correction", Precim Company, Portland, Oregon (6 pages).

Cobb, et al., "Fast Sparse Aerial Image Calculation for OPC", SPIE, vol. 2621, pp. 534–544, Sep. 20–22, 1995.

Lucas, K., et al., "Model Based OPC for 1st Generation 193nm Lithography", Motorola Inc., IDT assignee to IMEC (12 pages).

Stirninan, J., et al., "Quantifying Proximity and Related Effects in Advanced Wafer Processes", Precim Company, Hewlett Packard Labs (9 pages).

Sugawara, M., et al., "Practical Evaluation of Optical Proximity Effect Correction by EDM Methodology", Sony Corporation (11 pages).

Saleh, B., et al., "Reduction of Errors Microphotographic Reproductions by Optimal Corrections of Original Masks", Optical Engineering, vol. 20, No. 5, pp. 781–784, Sep./Oct. 1981.

Fu, C.C., et al., "Enhancement of Lithographic Patterns by Using Serif Features", IEEE, Transactions On Electron Devices, vol. 38, No. 12, pp. 2599–2603, Dec. 1991.

Harafuji, K., et al., "A Novel Hierarchical Approach for Proximity Effect Correction in Electron Beam Lithography", IEEE, vol. 12, No. 10, pp. 1508–1514, Oct. 1993.

Rieger, M., et al., "System for Lithography Proximity Compensation", Precim Company, Portland, Oregon, Sep. 1993 (28 pages).

Stirniman, J., et al., "Fast Proximity Correction with Zone Sampling", SPIE, vol. 2197, pp. 294–301 (1994).

Stirniman, J., et al., "Optimizing Proximity Correction for Wafer Fabrication Processes", SPIE, Photomask Technology And Management, vol. 2322, pp. 239–246 (1994).

Stirniman, J., et al., "Wafer Proximity Correction and Its Impact on Mask–Making", Racus News, vol. 10, Issue 1, pp. 1, 3–7, Jan. 10–12, 1994.

Henderson, R., et al., "Optical Proximity Effect Correction: An Emerging Technology", Microlithography World, pp. 6–12 (1994.

Barouch, E., et al., "OPTIMASK: An OPC Algorithm for Chrome and Phase–Shift Mask Design", SPIE, Vo. 2440, pp. 192–206, Feb. 1995.

Cobb, N., et al., "Fast, Low–Complexity Mask Designs", SPIE, vol. 2440, pp. 313–327. Feb. 22–24, 1995.

Yen, A., et al., "Characterization and Correction of Optical Proximity Effects in Deep–Ultraviolet Lithography Using Behavior Modeling", J. Vac. Sci. Technol. B. vol. 14, No. 6, pp. 4175–4178. Nov./Dec. 1996.

Morimoto, H., et al., "Next Generation Mask Strategy— Technologies are Ready for Mass Production of 256MDRAM?", SPIE, vol. 3236, pp. 188–189 (1997).

Park, C., et al., "An Automatic Gate CD Control for a Full Chip Scale SRAM Device", SPIE, vol. 3236, pp. 350–357 (1997).

Dolainsky, C., et al., "Application of a Simple Resist Model to Fast Optical Proximity Correction", SPIE, vol. 3051, pp. 774–780 (1997).

Chuang, II., et al., "Practical Applications of 2–D Optical Proximity Corrections for Enhanced Performance of $0.25 \mu m$ Random Logic Devices", IEEE, pp. 18.7.1–18.7.4, Dec. 1997.

Cobb, N., et al., "Experimental Results on Optical Proximity Correction With Variable Threshold Resist Model", SPIE, vol. 3051, pp. 458–468, Mar. 12–14, 1997.

Asai, N., et al., "Proposal for the Coma Aberration Dependent Overlay Error Compensation Technology", Jpn. J. Appl. Phys., vol. 37, pp. 6718–6722 (1998).

Cobb, N., "Fast Optical and Process Proximity Correction Algorithms for Integrated Circuit Manufacturing", Dissertation, University of California at Berkeley, UMI Microform 9902038 (139 pages).

Toublan, O., et al., "Phase Aware Proximity Correction for Advanced Masks", SPIE, vol. 4000, pp. 160–170, Mar. 1–3, 2000.

Anonymous, "Parameterization For Full Shape And Rule Dependent Dissection", IPCOM000009587D. Sep. 4, 2002 (9 pages).

* cited by examiner

REPETITION RECOGNITION USING SEGMENTS

BACKGROUND OF THE INVENTION

1. Field of the Invention

The invention relates to identifying repetitive patterns in a design layout to simplify processes, such as optical proximity correction (OPC), verification, or contour generation. Pattern identification using segments can significantly improve processing speed compared to more macro-level identification and can be combined with more macro-level identification approaches, such as those that identify repeated cell instances or geometry-based macro blocks.

2. Description of the Related Art

Optical proximity correction (OPC) applies systematic changes to geometries of the layout to improve the printability of a wafer pattern. Specifically, as the size of integrated circuit features drops to $0.18\mu$ and below, the features can become smaller than the wavelength of the light used to create such features, thereby creating lithographic distortions when printing the features onto the wafer. These lithographic distortions can represent significant impacts on device performance.

Rule-based OPC can include rules to implement certain changes to the layout, thereby compensating for some lithographic distortions. For example, to compensate for line-end shortening, rule-based OPC can add a hammerhead to a line end. Additionally, to compensate for corner rounding, rule-based OPC can add (or subtract) serif shapes from outer (or inner) corners. These changes can form features on the wafer that are closer to the original intended layout.

In model-based OPC, a real pattern transfer can be simulated (i.e. predicted) with a set of mathematical formulas (i.e. models). In model-based OPC, the edges of a feature in a layout can be dissected into a plurality of segments, thereby allowing these segments to be individually moved to correct for proximity effects. The placement of the dissection points is determined by the feature shape, size, and/or position relative to other features. In some embodiments, a fixed dissection length can be used for edges, e.g. every N nm. In other embodiments, multiple dissection lengths are provided, e.g. inner corner, outer corner, etc. In yet other embodiments, dissection points can be determined by exploring the optical and resist proximity behavior along the edges based on simulation or wafer results.

Verification is a process that also applies models to simulate the wafer images of the given pattern. However, instead of "correcting" the features as in model-based OPC, verification merely predicts the printed images and then compares them against the intended features, thereby providing a quantitative evaluation of the quality of the printing. Instead of providing a complete dissection of the features (as in model-based OPC), verification samples the features by selecting certain points or segments on the features on which to determine critical dimension (CD) errors (i.e. the deviation of the predicted printed images from the intended features). Note that the points or segments may coincide with the evaluation points or dissection segments of model-based OPC, or may be more fine or coarse depending on requirement. The CD error information provides a quantitative measure on the magnitude of lithographic distortions, thereby facilitating the evaluation of their severity. Generally, verification can be applied to pre-OPC and/or post-OPC layouts. As the circuit features ever increasingly drop deeper into sub-wavelength level, verification is becoming an increasingly important process.

Contour generation is a process of visualizing the printed images. This process, like verification, also samples the features at certain points or segments. However, instead of discrete CD errors, contour generation can generate sampled printed images and interpolates them to a continuous contour, which can be graphically displayed to provide a direct visualization of the printed images. Due to its similar sampling methodology, contour generation can be generically considered a type of verification process.

Because lithographic distortions can depend on many factors, including the density, size, and location of nearby features on the layout as well as photoresist parameters, the time to process this information can be considerable. Moreover, in light of this processing complexity, the tools to properly implement OPC or verification, especially model-based, are typically expensive. Therefore, a need arises for reducing the volume of information to be processed, thereby allowing the tools to more quickly process additional layouts.

Fortunately, design layouts for integrated circuits can be intrinsically repetitive. These repetitions can include shapes (i.e. polygons that represent certain geometrical features of the integrated circuit) or cells (e.g. predefined groups of shapes that may provide a certain functionality or represent repeating geometries). Identifying repetitions can be used in reducing the volume of information in the layout that needs to be processed. For example, once a repeating unit (e.g. a cell, or an area within a cell or across multiple cells) is identified, determining how to process the unit need only be done once for that cell.

However, layout hierarchies are usually function based, not geometry based. Therefore, repeating patterns or geometries may exist within a cell or among different cells that are not captured by the layout hierarchy. Moreover, if a hierarchical layout is flattened, then there is only one cell that represents the entire layout and all hierarchical information is lost.

Current methods for identifying repeating patterns have been cell-based or at most geometry-based. Unfortunately, the granularity of either identification method for OPC or verification may still be too coarse for commercial application. Therefore, a need arises for an improved pattern identification method and system.

SUMMARY OF THE INVENTION

Performing optical proximity correction (OPC) or verification of a layout can be time consuming and require the use of expensive tools. Organizing the layout using representative segments can minimize both of these resources. In accordance with one feature of the invention, shapes in a layout can be dissected into segments. Each segment along with its environment information can be compared to those stored in a searchable database (or any other information storage area, such as a table or memory). If the segment matches a listed segment, then the segment can be linked to, or associated with, the listed segment. If the segment does not match a listed segment, then a new database entry for that segment can be created.

Only one representative segment from each set of matched segments is used for processing (e.g. OPC or verification). In this manner, processing is performed on a reduced number of segments, thereby significantly improving resource allocation. The results from the representative segments can be propagated to their respective linked segments, thereby ensuring accuracy of the processing for all segments. At this point, the layout can be updated with the results from the processing.

Because proximity effects can be very accurately characterized by "corners" of geometries within a finite proximity range, matching of the segments environment can be done by identifying corners within a certain distance of each segment. This "effective area" defines a proximity neighborhood for the segment, wherein corners within the effective area can affect the printing of the segment. Any corner found to be within the effective area of a segment can be represented in a sortable format so that all corners within the area can be sorted for more efficient comparison. In one embodiment, the format can include a relative position of each corner and at least one angle associated with each corner. This effective area for the segment together with all the corners within the area is referred to as the "proximity environment" for the segment.

In another embodiment, multiple pass identification can be used to reduce repetition identification time. In multiple pass identification, analysis begins with polygons (larger scale elements) and proceeds to portions of edges (smaller scale elements). In this method, the layout data can be partitioned into units. A unit could be a predefined area, a cell (i.e. a predefined set of polygons), or an instance. Polygons within each unit can be identified. Each polygon can be compared to polygons stored in a polygon database. If the polygon matches a listed polygon, then the polygon can be linked to the listed polygon. If the polygon does not match a listed polygon, then a new database entry for that polygon can be created.

In the next level of analysis, polygon edges can be used. Specifically, for each non-repeating polygon in the polygon database, the polygon edges of that non-repeating polygon can be identified. Each polygon edge can then be compared to polygon edges stored in an edge database. If the polygon edge matches a listed polygon edge, then the polygon edge can be linked to the listed polygon edge. If the polygon edge does not match a listed polygon edge, then a new database entry for that polygon edge can be created.

In the next level of analysis, half-edges can be used. Specifically, for each non-repeating polygon edge in the edge database, the half-edges of that non-repeating polygon edge can be identified. Each half-edge can then be compared to half-edges stored in a half-edge database. If the half-edge matches a listed half-edge, then the half-edge can be linked to the listed half-edge. If the half-edge does not match a listed half-edge, then a new database entry for that half-edge can be created.

This level of analysis can be followed with segment matching. Specifically, for each non-repeating half-edge in the half-edge database, various segments of that non-repeating half-edge can be identified. Each segment can be compared to segments stored in a segment database. If the segment matches a listed segment, then the segment can be linked to the listed segment. If the segment does not match a listed segment, then a new database entry for that segment can be created.

One embodiment of the invention can include a method of manufacturing an integrated circuit. This method can include the above-described steps, i.e. segment matching, multiple pass identification, or variations on those steps. The method can also include the steps of generating a binary mask based on the updated layout and exposing a wafer to electromagnetic radiation using the binary mask.

Another embodiment of the invention can include a system for processing a layout. The system can include the means for partitioning the layout into units, the means for dissecting geometric structures in a unit into segments, the means for matching a segment with a listed segment in a database if the segment and the listed segment have substantially the same environment, the means for creating a new database entry if the segment and the listed segment do not have substantially the same environment, the means for determining an OPC bias or a verification error for a representative segment, the means for copying the OPC bias or verification error to any segments linked to the representative segment, and the means for updating the layout with the results.

DETAILED DESCRIPTION OF THE DRAWINGS

In accordance with one feature of the invention, a micro-level solution can increase the number of potential repetitions in a layout, thereby significantly improving processing efficiency. Specifically, in one embodiment, instead of macro-level solutions including shapes and/or cells, segments can be used to identify repetitions. These segments can be efficiently organized in a database, thereby facilitating the subsequent sorting and identifying of the segments.

Figure 1:
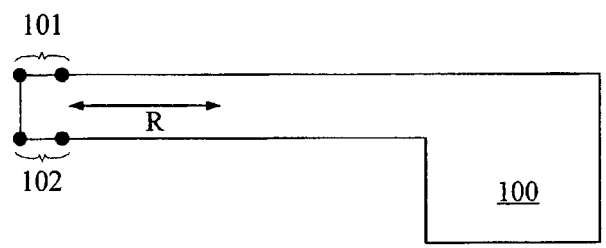
FIG. 1 illustrates a shape that exhibits partial symmetry.

FIG. 1 illustrates a shape 100 that exhibits "partial symmetry", i.e. the geometry of shape 100 is not symmetrical. However, portions of shape 100, e.g. segments 101 and 102, are locally symmetrical. In other words, because the distance from each segment to any other non-identical feature of shape 100 is longer than a radius R (within which proximity effects are considered), then the printing of segments 101 and 102 should be substantially identical. Hence, segments 101 and 102 should require the same processing.

Thus, to reduce processing time on shape 100, processing could be done on one of the two segments, e.g. segment 101. Then, the processing result could be copied to segment 102. Because the model-based processing (e.g. OPC and verification) time is significantly longer than the time needed for copying, dramatic savings in time can be achieved by recognizing the similarity of segments in a layout.

Figure 2:
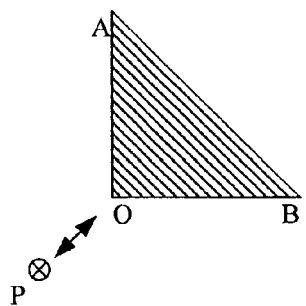
FIG. 2 illustrates a basic proximity model concept, wherein the effect of a corner on a point diminishes as the distance between the corner and the point increases.

A commonly used spatial proximity model is based on "corner responses". In this modeling technique, the calculation of the optical property of a point can be carried out by summing up the responses to the optical system of all the corners that have an effect on that point. Generally, the proximity effect of one feature on another gradually diminishes as the distance between the features increases. For example, in FIG. 2, the effect of corner AOB on point P diminishes as the distance PO increases. Thus, when distance PO is large enough, the effect of corner AOB on point P can be ignored without sacrificing accuracy for OPC or verification.

Figure 3A:
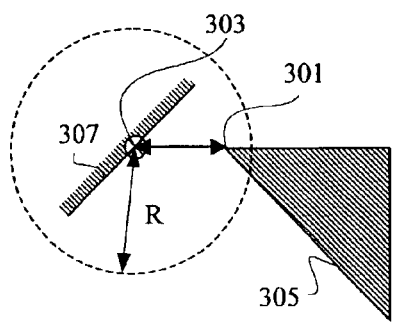
FIGS. 3A and 3B illustrate geometries that are different, but provide substantially identical proximity environments.
Figure 3B:
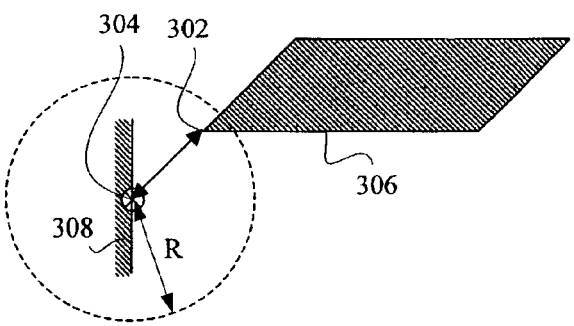

In one embodiment, comparing corners in a proximity area (e.g. within a radius R of a point) can identify locations with equivalent proximity environments. For example, in FIGS. 3A and 3B, edges 307 and 308 are different in orientations and geometries 305 and 306, which include corners 301 and 302, respectively, may be dramatically different. However, because corners 301 and 302 are similar in angular value (i.e. the value of the angle of the corner) and have similar distances and orientations from edges 307 and 308 within the radius R, edges 307 and 308 evaluated at points 303 and 304 effectively have substantially identical proximity environments. Thus, under symmetrical illumination conditions, the OPC for edges 307 and 308 would be the same. For example, OPC would include identical bias values for edges 307 and 308.

Thus, in accordance with one feature of the invention, the proximity environment of various segments in a layout can be determined so that "matched" segments are processed only once. Note that the identification of these matched segments may contribute some overhead to the total processing time depending on implementation. However, minimizing the amount of computationally expensive processing that would otherwise be performed for each shape (or edge of a shape) in a layout can significantly reduce the total processing time. Moreover, matched segments are guaranteed to have the same processing results, which significantly improves the symmetry of the processing results. Maintaining symmetry advantageously improves the fidelity of the output and ensures printing uniformity after processing that affects positively on the lithographic process.

Figure 4:
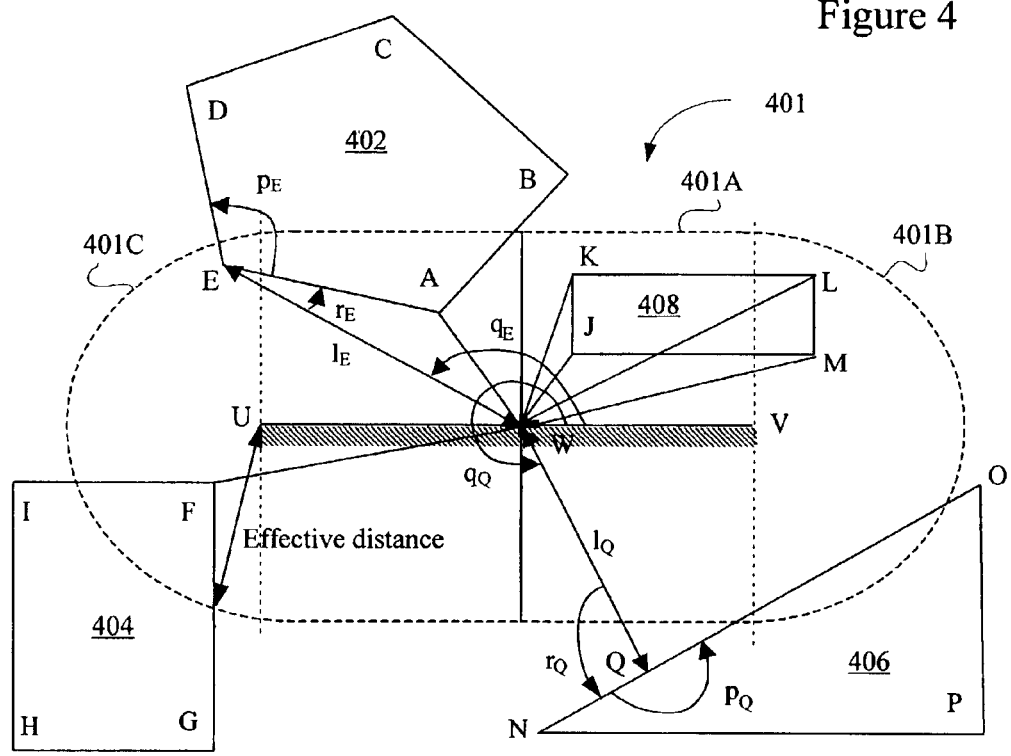
FIG. 4 illustrates an exemplary segment and a plurality of corners within an effective area that can affect the printing of the segment.

Therefore, in one embodiment, corners within an effective area can be identified for each segment. For example, FIG. 4 illustrates a segment UV that represents a segment on which OPC will potentially be performed. A point W on segment UV represents an evaluation point of the segment, wherein OPC is uniformly applied to segment UV. In other words, the same bias is to be applied to the entire segment UV.

An effective area 401 (comprising a rectangle 401A and two half-circles 401B and 401C) is defined by an effective distance from segment UV, wherein shapes within the effective distance can cause proximity effects that affect the printing of segment UV. Theoretically, if the effective distance is chosen to be infinite, then any two segments having the same proximity environment are truly equivalent. Practically, an effective distance in the neighborhood of the model radius is appropriate.

In one embodiment, the effective distance is chosen to be equal to the model radius. In other words, a radial area with a radius equal to the model radius could theoretically be created for each point on segment UV, wherein the union of all such areas could define effective area 401.

In another embodiment, the effective distance can be chosen to be shorter than the model radius when using such effective distance simplifies analysis without loss of accuracy. In yet another embodiment, the effective distance can be chosen to be longer than the model radius, thereby further reducing the error caused by inconsistent OPC features.

In yet another embodiment, the effective distance can be chosen based on each segment's criticality, i.e. the distance can be shape dependent. For example, suppose inner corners are not as critical as normal edges and therefore are allowed larger errors, whereas normal edges are more critical and therefore have low tolerance on errors. In this case, the effective distance for inner corners can be chosen to be shorter, whereas the effective distance for normal edges can be chosen to be longer.

In yet another embodiment, the effective area can be chosen to be rectangular, instead of circular, because rectangular areas are easier to handle with common geometry operations.

Figure 5:
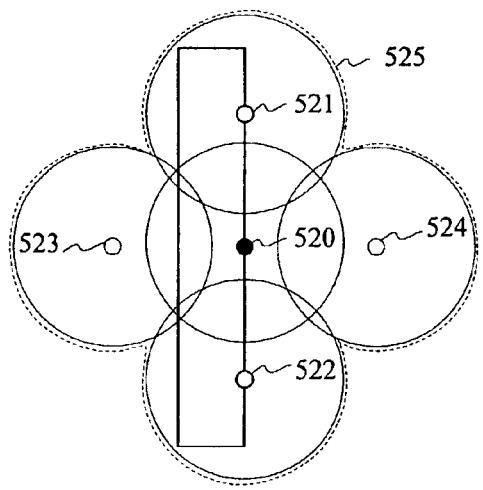
FIG. 5 illustrates an effective area that can be built using predetermined points to evaluate light intensity.

In yet another embodiment, the effective area can be built using predetermined points to evaluate light intensity. For example, in FIG. 5, radial areas surrounding evaluation point 520 and four supplemental points 521, 522, 523, and 524 can be used to define an effective area 525 (i.e. the area defined by the dashed perimeter). In one embodiment, supplemental points 521, 522, 523, and 524 are located a predetermined distance in each cardinal direction from evaluation point 520. Notice that the points, including the evaluation point, may not be associated with a dissection of a feature. This is particularly useful for verification, which merely samples certain points or segments.

Of importance, irrespective of the shape of the effective area (e.g. circle, rectangle, or irregular), the corners within the effective area can define the proximity environment of the segment. For example, referring back to FIG. 4, four geometries 402, 404, 406, and 408 intersect effective area 401. Geometry 402 is defined by corners A, B, C, D, and E; geometry 404 is defined by corners F, G, H, and I; geometry 406 is defined by corners N, O, and P; and geometry 408 is defined by corners J, K, L, and M. In FIG. 4, corners A, E, F, J, K, L, M are determined to be within effective area 401, whereas corners B, C, D, G, H, I, N, O, P are determined to be outside effective area 401.

In one embodiment, for each corner within effective area 401, four quantities can be recorded: a relative position given by the relative x and y coordinates on a layout (or, alternatively, a projection distance combined with a projection angle) and two angles for the corner itself. The projection distance can be defined as the distance between the vertex of the corner and the evaluation point W. The projection angle can be defined as the angle between a line representing the projection distance and edge UV. For example, referring to corner E, $l_E$ is the projection distance, $q_E$ is the projection angle, $p_E$ is the angle of the corner itself, and $r_E$ is the angle from the line representing the projection distance and the edge from which $p_E$ is measured. Note that $l_E$, $q_E$ and $r_E$ are all relative quantities, where $l_E$ is relative to the position of the edge, and $q_E$ and $r_E$ are relative to the orientation of the edge, thereby rendering the absolute position and orientation of the corners unimportant. In one embodiment, a four-element vector set can represent each corner. For example, the vector set ($q_E$, $l_E$, $r_E$, $p_E$) could represent corner E. Advantageously, such representation is a sortable format, wherein the vector sets can be easily sorted using standard methods, e.g. a dictionary method.

Note that geometry 406 intersects effective area 401, but its corners N, O, and P are outside effective area 401. Because of its proximity effect on edge UV (as indicated by the intersection of effective area 401), geometry 406 should be included in the analysis of the proximity environment. However, its effect on edge UV is not in the form of a corner, as described above, but as an edge NO. Therefore, to uniformly apply the above-described corner analysis, edge NO can be converted into a "pseudo-corner". In a pseudo-corner, the vertex of the pseudo corner can be found by projecting point W perpendicular to the edge intersecting effective area 401 (i.e. the edge NO defined by corners N and O). In one embodiment, the same sortable four-element vector set can represent each pseudo corner. For example, a vector set ($q_Q$, $l_Q$, $r_Q$, $p_Q$) could represent edge NO as a pseudo corner, wherein $r_Q$ is 90 degrees and $p_Q$ is 180 degrees. Note that in some cases, it is possible that the projection distance $l_Q$ is longer than the effective distance, or the point Q may be off the edge NO.

In accordance with one feature of the invention, in addition to characterizing the relevant corners for each segment, the segment itself is also characterized. A segment is determined by four quantities: its position as represented by the x and y coordinates, its length, and its orientation as represented by its angle. The printing of the segment is independent of segment position as the lithography system is substantially translation invariant. Therefore the position of the segment is not used to characterize the segment. The orientation of the segment has an affect on the printing of the segment only when the lithography system is rotation variant, which is the case for most off-axis illumination condition such as Dipole or Quadrupole, or when the optical system is subject to asymmetric aberration. In other cases, such as the circular or annular illumination condition with no aberration, the printing of the segment will not be affected by its orientation. Therefore, orientation of the segment is needed in characterizing the segment only when the optical system is rotation variant. The length of the segment affects the printing of the segment when OPC is applied, therefore segment length should be used to characterize the segment for OPC application, but is not necessary for verification. In summary, the quantities used to characterize the segment itself are the length and/or angle of the segment depending on application.

Note that FIG. 4 represents a single layer analysis in which polygons or portions thereof do not coincide. In another embodiment of the invention, when multiple layers need to be considered (e.g. a double exposure phase shifting mask (PSM) and its corresponding trim mask), a fifth element can be added in each vector set. Specifically, the fifth element of the vector set could indicate the layer information, thereby distinguishing coinciding corners from different layers. At this point, the five-element corner information can be organized in the sortable format so that all corners related to each segment from all layers can be sorted and stored in a database.

Figure 6A:
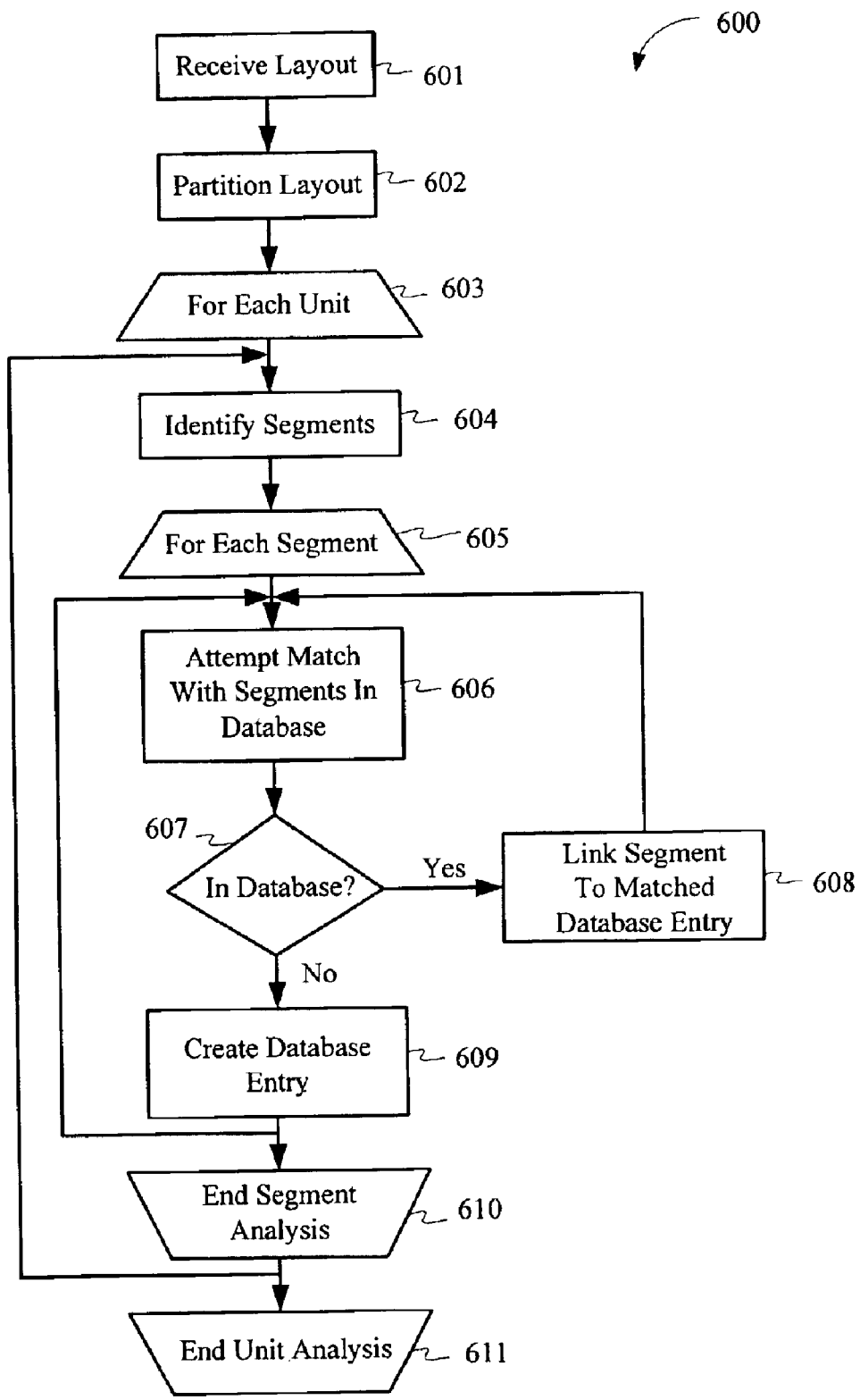
FIG. 6A illustrates a process flow in which segments can be linked in a database based on matching corners.

FIG. 6A illustrates a process flow 600 in which like segments can be linked in a database based on matching corners within the surrounding area. In process flow 600, a layout is received in step 601. This layout could be in GDS-II format or in any other format used by lithographic tools. In step 602, this layout can be partitioned into a plurality of units to facilitate analysis. In one embodiment, the units can comprise uniformly sized blocks, wherein the size of the blocks can be based on the complexity of the design. In another embodiment, the size of the blocks can be based on processor speed. In yet another embodiment, the units can comprise cells or instances that implement the layout. For ease of reference, the term "unit" will refer to a block, a cell, or an instance that facilitates partitioning.

For each unit (step 603), segments within the unit can be identified in step 604. In one embodiment, this identification can include performing a dissection of features or portions of features within the unit. In some embodiments, the approaches described in U.S. patent application Ser. Nos. 09/675,582, 09/675,197, 09/676,375, and 09/676,356 are used to segment the polygons within the units and place evaluation and dissection points and are incorporated by reference herein.

For each segment (step 605) being analyzed, step 606 attempts to match the current segment with segments already listed in a database by comparing their segment characteristics and the respective corners in the surrounding area. This database can be loaded, if already created, or can be developed on the fly. Note that the term database is used in the general sense to refer to one or more computer accessible data structures for storing information. In some embodiments, relational database products, such as those provided by Oracle and mySQL, may be used to store the information. In other embodiments, one or more data structures specific to the application performing the process of FIG. 6A may store the information.

If the segment is matched with a listed segment in the database, as determined in step 607, then the current segment can be linked to the matched database entry in step 608. At this point, the process returns to the next segment, if present, within the unit. If the current segment cannot be matched to listed segments in the database, then a database entry for the current segment can be created in step 609.

After all segments within a unit have been analyzed, segment analysis ends in step 610. At this point, the next unit, if present, can be analyzed and the process returns to step 604. After all units within the layout have been analyzed, unit analysis ends in step 611. Note that the database can cross unit boundaries depending on the size limit and the query/processing speed of the database. In one embodiment of the invention, one database can be maintained across all units of the layout, wherein segments having a low repeat rate are replaced by new segments as the process continues so that the size of the database is limited to a certain size. In another embodiment, a database is maintained at a central repository that can be accessed by different processing units such as CPUs (multi-threaded) or individual machines (distributed processing).

Figure 6B:
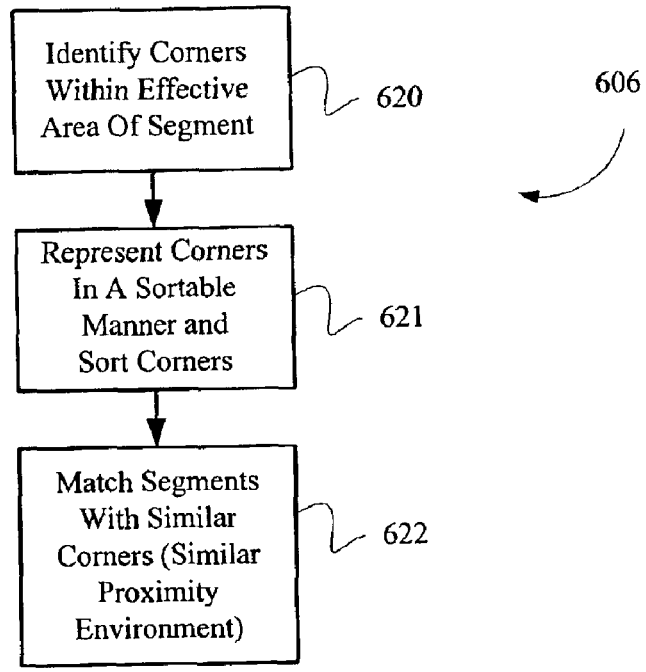
FIG. 6B illustrates various steps associated with segment matching.

In accordance with one feature of the invention, the matching performed in step 606 can use the effective area (see, for example, the description in reference to FIG. 4). Specifically, step 606 can include identifying the corners within the effective area of the segment in step 620, as shown in FIG. 6B. In step 621, these corners can be represented in a sortable format and sorted. In one embodiment, corners can be represented using the four-element vector described in reference to FIG. 4 (or a five-element vector for multiple mask layouts). In step 622, segments can be matched using these corner representations. Segments having identical corners should have identical proximity environments. Therefore, processing that is determined to be appropriate for one such segment can be applied to all matching segments, which are linked in the database. Note that if a current segment does not match any listed segments in the database, as determined by its relevant corners, then step 609 further includes associating the newly entered segment in the database with the segment's relevant corner information, thereby facilitating subsequent segment matching.

Figure 6C:
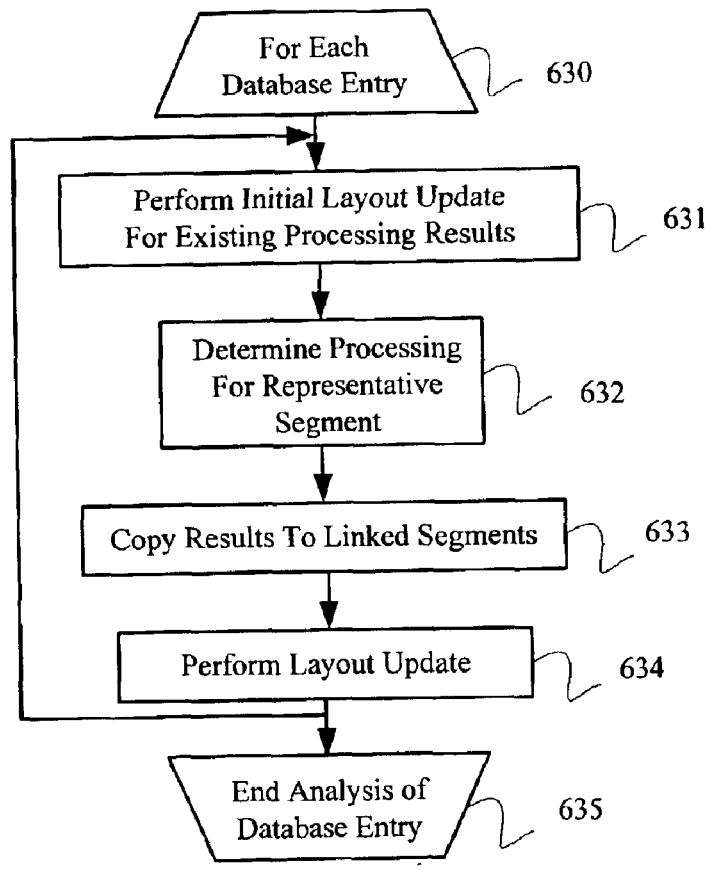
FIG. 6C illustrates an exemplary flow for the processing of each entry in the database.

FIG. 6C illustrates an exemplary flow for the processing of each entry in the database (step 630). In step 631, an initial layout update can be performed for segments whose processing results already exist in the database. In other words, if processing results (e.g. in model-based OPC, the processing results can include biases) for certain types of segments have already been determined in prior processing units or layouts, or by manual settings, then those segments do not need to be processed again.

In step 632, for segments without existing results, a representative segment can be chosen and the appropriate processing for that segment can be determined. In other words, only one segment for each entry in the database needs to be processed. In step 633, the processing result for the representative segment can be copied to its linked segments. The layout can be updated with this information in step 634. In one embodiment, the processing may be iterative (e.g. model-based OPC). In this case, after step 635, the results are tested for convergence. Those segments that do not meet the specified criteria will be re-adjusted as the process loops back to step 632. The halting conditions remain the same as the standard process. In another embodiment, after all database entries are processed (step 635), the results can be stored for future use. After completing step 635, the process can return to step 604 in FIG. 6A for the next unit.

Note that when the number of segments in a layout is large, the database may take a sizable amount of memory. However, of importance, building the database precedes any memory intensive computation (e.g. simulations associated with determining the appropriate processing for the segments of the layout). Thus, in one embodiment after the database is built, the relevant corner information may be transferred to disk, thereby only keeping the repetition association in memory. In one embodiment, only those entries that have over a predetermined number of linked segments are transferred. The complete database can be reloaded into memory when a new unit or layout is ready to be processed. Compared with processing each segment individually, the processing of the database entries (while excluding the processing of the linked segments) can significantly reduce memory because fewer segments are processed.

Figure 7:
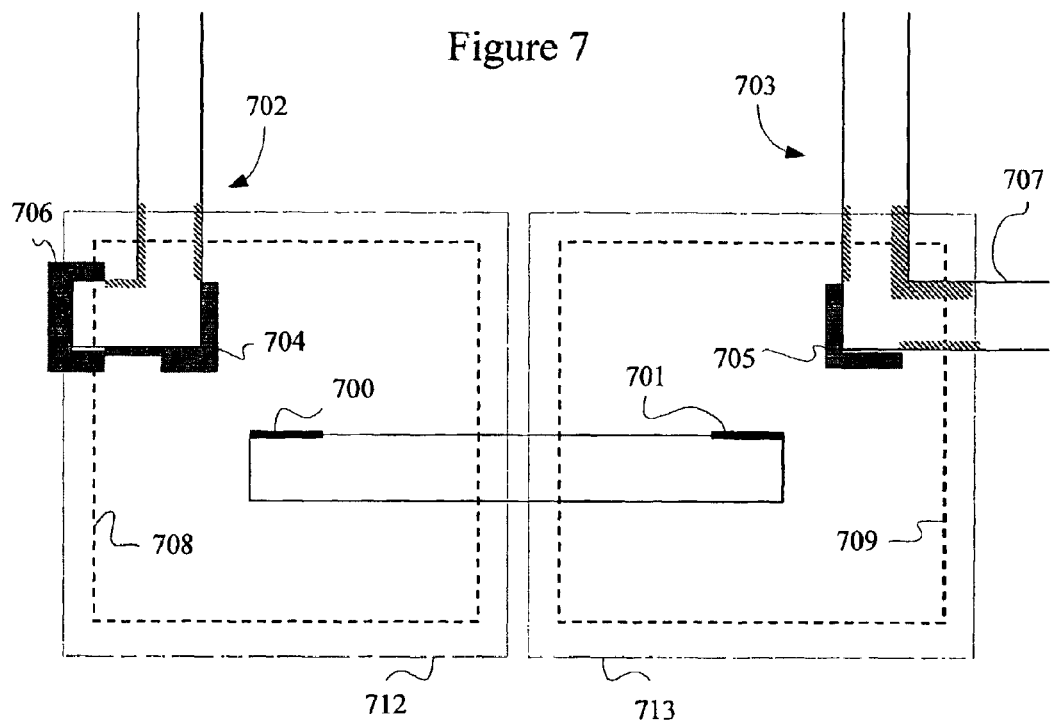
FIG. 7 illustrates one embodiment in which additional information outside the effective area can be used to accurately perform OPC.

In accordance with one embodiment of the invention, additional information outside the effective area can be used for accurate processing. For example, referring to an OPC example, FIG. 7 illustrates two segments 700 and 701 that could be considered equivalent based on the matching of corners 704 and 705 (mirrored symmetries) which are located in the rectangular effective areas 708 and 709, respectively. However, the geometries containing corners 704 and 705 are dramatically different outside of effective areas 708 and 709. Specifically, corner 704, which forms part of geometry 702, has a line end 706 immediately outside effective area 708. In contrast, corner 705, which forms part of geometry 703, continues as a long line 707 outside of effective area 709. The shading associated with geometries 702 and 703 indicate optimal OPC corrections, i.e outer and inner serifs, assuming knowledge of geometries 702 and 703 The difference in OPC corrections within the effective areas of segments 700 and 701 could cause the corrections for segments 700 and 701 to be different. Thus, ideally, segments 700 and 701 should not be deemed equivalent for OPC.

Therefore, in one embodiment, to increase the information associated with the corners, the effective area can be slightly enlarged. For example, if effective areas 708 and 709 were enlarged to effective areas 712 and 713, respectively, the two corners of line end 706 for segment 700 would not be matched by corners of segment 701. Thus, segments 700 and 701 would not be deemed equivalent if the effective area could be enlarged to incorporate relevant information. However, note that the size of the effective area can compromise the size and speed of the database as well as processing accuracy. Therefore, in one embodiment, users can be given discretion in determining the size of the effective areas. For example, users could use their experience or pre-run simulations to determine the effective areas for different features, such as line ends, inner corners, or outer corners.

In another OPC embodiment, dissections normally performed for model-based OPC can be used instead of geometry corners to increase the information associated with the segments. Specifically, OPC biases are sensitive to dissection, so different dissections can lead to different bias values. For example, assume that every edge of every shape in the layout is dissected. At this point, the above-described corner information could become a subset of the dissection information (i.e. a corner is simply two segments connecting each other with an angle). In other words, the environment for each segment could include all its neighboring segments. In this manner, if two segments have the same neighboring segments, then these segments will clearly have the same environment. Thus, the two segments can be identified as equivalent by matching their dissection environments. In reference to FIG. 6B, the identification and representation of neighboring corners (steps 620 and 621) could be replaced by the identification and representation of neighboring segments. Note that if the two segments merely have matching corners (like segments 700 and 701), these segment are not guaranteed to have the same dissection environment. Therefore, using dissection environments typically results in fewer identified repetitions than using corner matching.

Figure 8A:
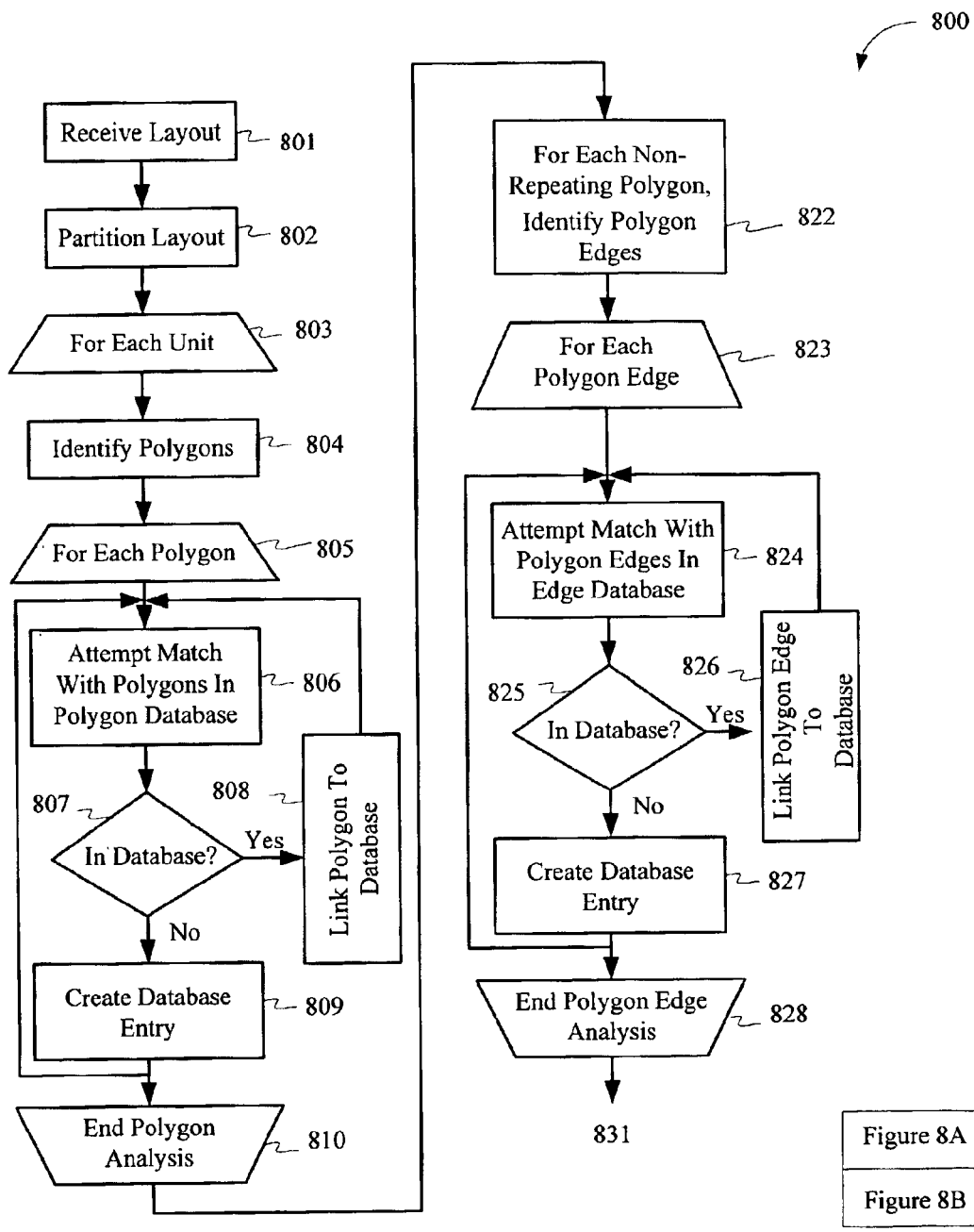
FIGS. 8A and 8B illustrate an exemplary process flow that implements multiple pass identification.
Figure 8B:
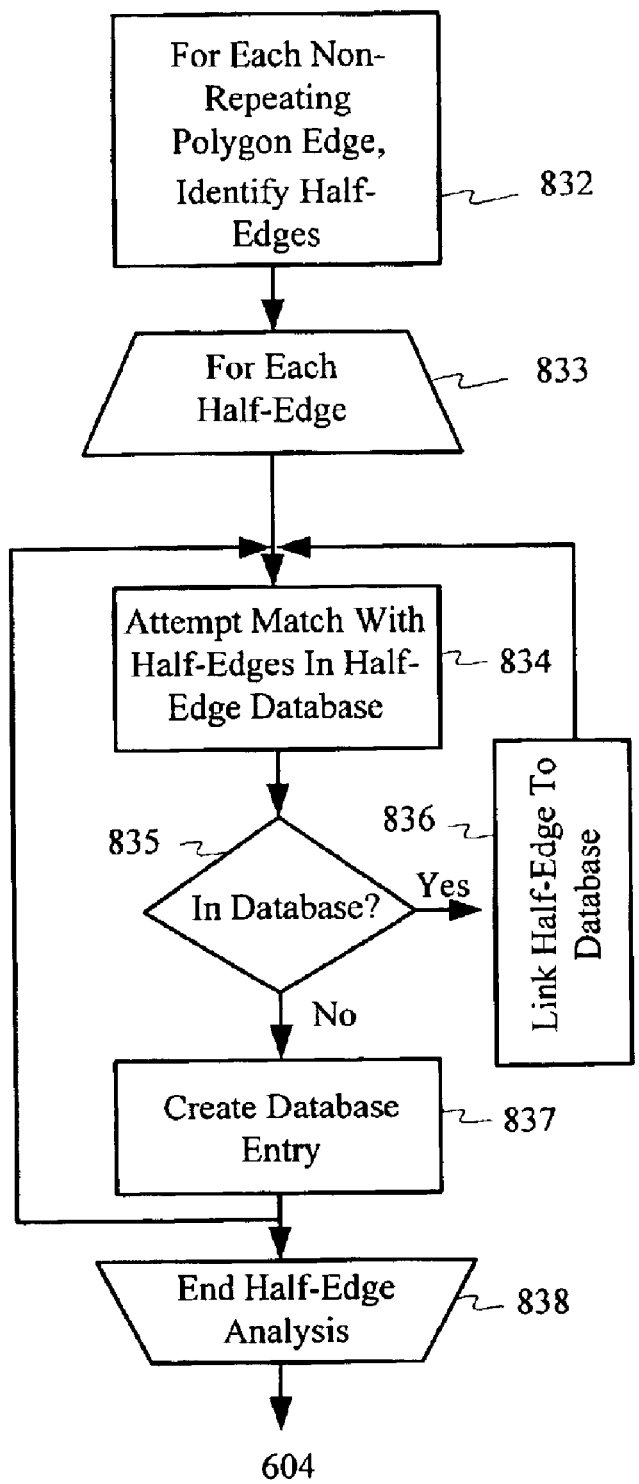

In yet another embodiment, multiple pass identification can be used to reduce repetition identification time. In multiple pass identification, analysis begins with polygons (large scale elements) and proceeds to portions of edges (small scale elements). FIGS. 8A and 8B illustrate an exemplary process flow 800 that implements multiple pass identification. In process flow 800, a layout is received in step 801. In step 802, this layout can be partitioned into a plurality of units (described in reference to FIG. 6A). For each unit (step 803), polygons within the unit can be identified in step 804, wherein the polygon is the first level of analysis.

Figure 8C:
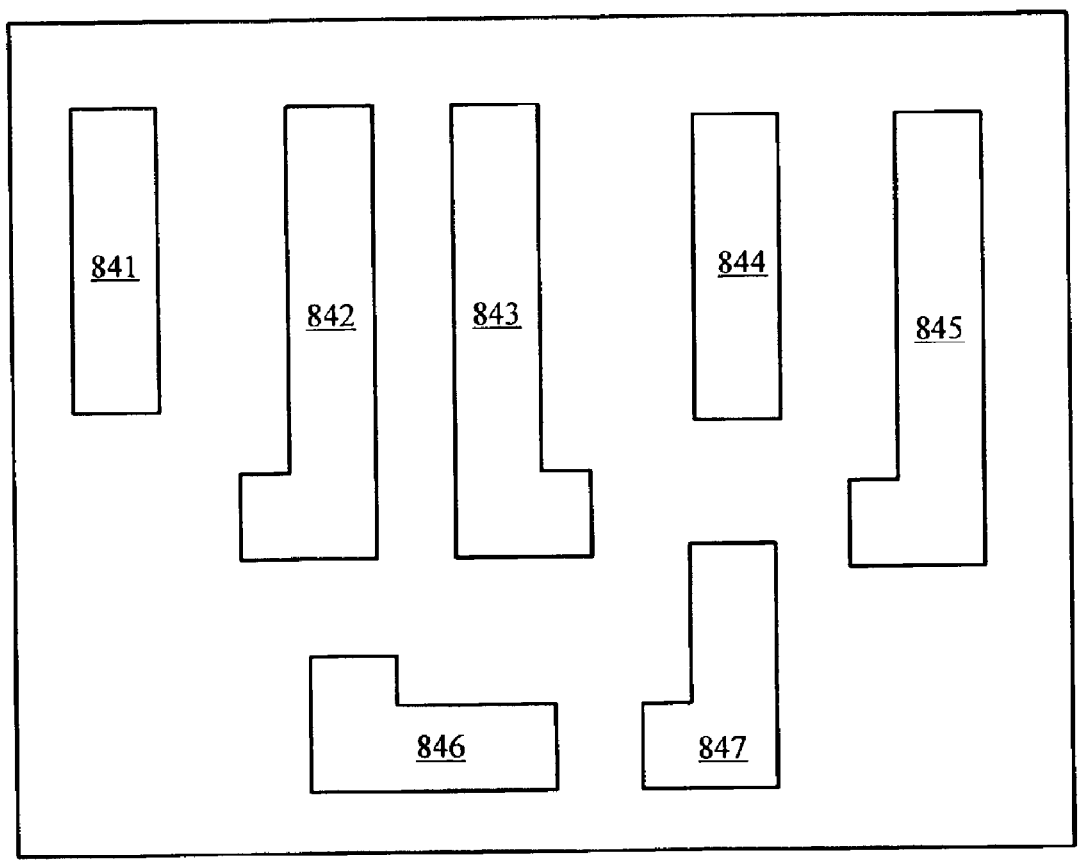
FIG. 8C illustrates shapes that can be characterized as "rotated", "self-symmetric", "mirrored", and "repeated" shape repetitions.

For each polygon (step 805), step 806 attempts to match that polygon with polygons already listed in a polygon database. In accordance with this embodiment, shapes can be manipulated in various ways, but still be matching. For example, referring to FIG. 8C, shapes 846 and 847 can be characterized as "rotated" shape repetitions, shapes 841 and 844 can be characterized as "self-symmetric" shape repetitions, shapes 842 and 843 can be characterized as "mirrored" shape repetitions, and shapes 842 and 845 can be characterized as "repeated" shape repetitions.

If that polygon is in the database, as determined in step 807, then that polygon is linked to the database in step 808. At this point, the process returns to the next polygon within the unit, if present. (Note that in one embodiment, a polygon could cross unit boundaries. Thus, one unique polygon could be provided per database entry.) If the polygon is not in the database, then a database entry for that polygon can be created in step 809.

After all polygons within a unit have been analyzed, polygon analysis ends in step 810. For each non-repeating polygon, polygon edges within each representative polygon can be identified in step 822, wherein the polygon edge is the second level of analysis. For each polygon edge (step 823), step 824 attempts to match that polygon edge with polygon edges already listed in an edge database. If that polygon edge is in the database, as determined in step 825, then that polygon edge is linked to the database entry in step 826. (Note that in one embodiment, a polygon edge could cross unit boundaries. Thus, one unique polygon edge could be provided per database entry.) At this point, the process returns to the next polygon edge within the polygon database, if present. If the polygon edge is not in the database, then a database entry for that polygon edge can be created in step 827.

After all polygon edges within the polygon database have been analyzed, polygon edge analysis ends in step 828. For each non-repeating polygon edge (step 831), half-edges can be identified in step 832, wherein the half-edge is the third level of analysis. A half-edge is a half portion of an edge of a polygon. For each half-edge (step 833), step 834 attempts to match that half-edge with half-edges already listed in a half-edge database. If that half-edge is in the database, as determined in step 835, then that half-edge is linked to the database in step 836. (Note that in one embodiment, a half edge could cross unit boundaries. Thus, one unique half-edge could be provided per database entry.) At this point, the process returns to the next half-edge, if present, within the edge database. If the half-edge is not in the database, then a database entry for that half-edge can be created in step 837. After all half-edges within the edge database have been analyzed, half-edge analysis ends in step 838. In one embodiment, process 600 can follow immediately after step 804.

Figure 8D:
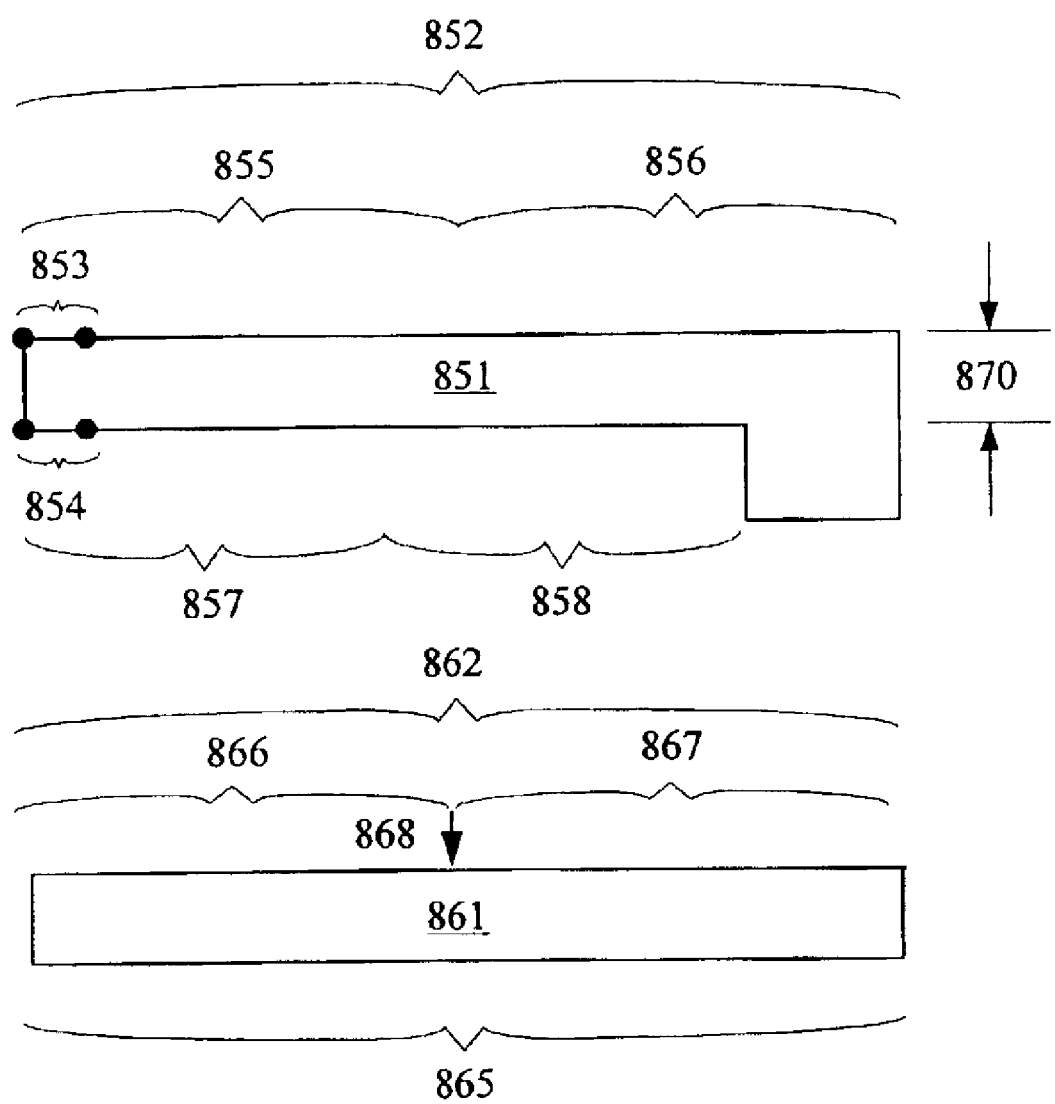
FIG. 8D illustrates exemplary polygons in reference to the three levels of analysis (i.e. polygon, polygon edge, and half-edge).

FIG. 8D illustrates exemplary polygons in reference to the three levels of analysis (i.e. polygon, polygon edge, and half-edge). Specifically, FIG. 8D illustrates two polygons 851 and 861 that have different proximity environments within an effective distance (not shown explicitly) and therefore would not match in step 807. However, edges from the same or different polygons can match if their proximity environments are the same. For example, assuming that the effective distance is less than distance 870, then edges 852, 862, and 865 would match in step 825. On the other hand, if the effective distance is slightly larger than distance 870, then only edges 862 and 865 would match.

As described in reference to step 832, the third level of analysis is a half-edge, which can identify the mirrored self-symmetry of the same edge. For example, referring to polygon 861 in FIG. 8D, edge 862 is self-symmetric. In other words, if a cut were made midpoint (marked by arrow 868) on edge 862, then half-edges 866 and 867 would be mirror images of one another and thus would match in step 835. The same is true for half-edges 855 and 856, but not for half-edges 857 and 858.

Note that process flow 800 is further supplemented with the segment identification described in reference to FIG. 6A. For example, half-edge 855 and edge 857 could be dissected into segments, such as segments 853 and 854, which through segment analysis could be determined to match.

Figure 9:
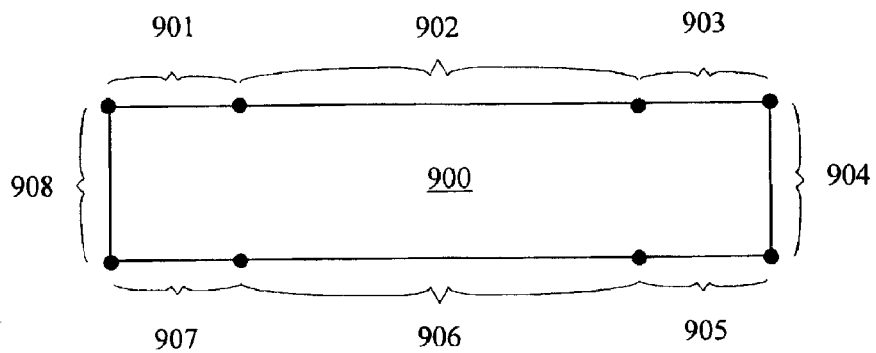
FIG. 9 illustrates a polygon that has been dissected into segments to facilitate OPC corrections.

Note that segment matching can provide significant benefits in symmetry for some OPC applications such as "segment-progressive" OPC. Specifically, in model-based OPC, correction can be made on each segment based on any corrections previously made. For example, FIG. 9 illustrates a polygon 900 that has been dissected into segments 901–908 to facilitate OPC corrections. Assuming that the segments are corrected in numerical order, if a bias is provided to correct segment 901, no other biases are available (assuming that polygon 900 is the first polygon). After segment 901 is corrected for OPC, then that bias can be applied to the correction of segment 902. Similarly, when correcting segment 903, the biases of segments 901 and 902 are available. In one embodiment, all prior biases can be applied to the OPC processing of the current segment. That is, when correcting segment 907, the bias values for segments 901–906 can be used. This use of previous biases is referred to as "segment-progressive" OPC.

Segment-progressive OPC can facilitate convergence in the iterative OPC process. Specifically, model-based OPC is typically performed multiple iterations for each segment. Thus, leveraging bias information from previously corrected segments can result in a solution achieved in fewer iterations than if such bias information were not used. However, because the leveraged bias information is constantly changing during the OPC process, the biases for seemingly identical segments can vary. For example, the biases for segments 901, 903, 905, and 907 can be significantly different because their biases would be generated based on different information (e.g. segment 901 would have significantly different bias information than segment 907). Thus, segment-progressive OPC can create asymmetrical OPC corrections to segments that actually have the same proximity environment.

In contrast, by using segment matching in accordance with process flow 600 (FIG. 6A), the OPC results for segment 901 (which could be designated the representative segment) could be copied to segments 903, 905, and 907, thereby ensuring symmetrical OPC corrections for segments 901, 903, 905, and 907.

In one embodiment, segment matching can be supplemented with segment-progressive OPC. In other words, a first set of matching segments could include segments 901, 903, 905, and 907; a second set of matching segments could include segments 902 and 906; and a third set of matching segments could include segments 904 and 908. During OPC, segment 901 can be corrected assuming no additional bias information (i.e. no biases are known). Then, segment 902 can be corrected assuming the bias of segment 901 (as well as its associated biases to segments 903, 905, and 907). Then, segment 904 can be corrected assuming the bias of segment 901 (its associated biases to segments 903, 905, and 907) and the bias of segment 902 (and its associated bias to segment 906). In this manner, a symmetrical OPC solution can be provided while significantly increasing convergence speed.

Of importance, some illumination types are not symmetric across all directions. For example, dipole illumination is not symmetrical between vertical and horizontal directions.

In other words, the same shape rotated by 90 degrees under dipole illumination will create images that are not rotationally symmetric. In another example, quasar illumination is not symmetric between straight directions (i.e. vertical and horizontal) and 45 degree directions. In other words, the same shape rotated by 45 degrees under quasar illumination will not create rotationally symmetric images.

Therefore, in accordance with one embodiment of the invention, illumination asymmetry can be taken into account when performing repetition identification. In one embodiment, this illumination effect can be specified before starting the identification process (steps 606–607 of FIG. 6A). For example, if dipole illumination is used, then horizontal and vertical symmetries would not be identified as repetitions. Hence, segments having horizontal and vertical symmetries would need to be processed separately.

Figure 10:
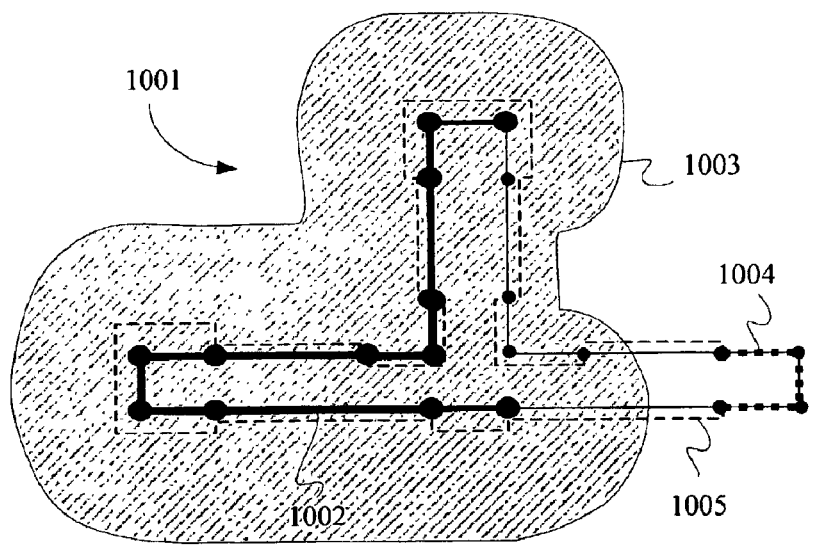
FIG. 10 illustrates a polygon in which performing an intermediate layout update can be limited to the portions of the layout that have an effect on subsequent processing.

In accordance with one embodiment of the invention, performing the layout update in step 634 (FIG. 6C) can be limited to the portions of the layout that have an effect on subsequent processing in an iterative process (e.g. model-based OPC). These portions can be determined by combining all effective areas of the representative segments. FIG. 10 illustrates a polygon 1001 formed by a plurality of segments. The bold segments (e.g. segment 1002) indicate representative segments in a database. Combining the effective areas of the representative segments forms a shaded area 1003.

Of importance, the dashed bold segments (e.g. segment 1004) are outside of shaded area 1003, and therefore updating the layout for those segments can be done at the final step when the layout is updated for OPC output in GDS-II format. In other words, those segments will have no effect in the processing of the representative segments and therefore including their associated bias information is not necessary in step 631 in between OPC iterations. In polygon 1001, the intermediate layout results for OPC in step 631 could be represented by a dashed perimeter 1005.

Figure 11:
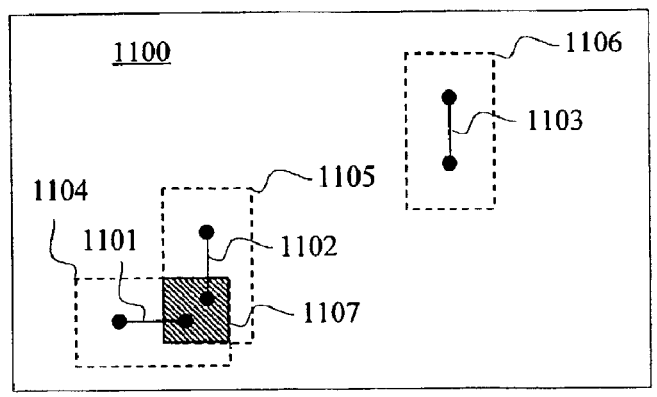
FIG. 11 includes a simplified layout in which grouping representative segments can advantageously reduce the processing area.

Theoretically, for all the segments that are identified to be the same, any one can be chosen as the representative segment. Practically, clustering the representative segments, i.e picking representative segments neighboring each other, can advantageously reduce the processing area, thereby minimizing both storage space and processing time. For example, FIG. 11 includes a simplified layout 1100 including segments 1101, 1102, and 1103. Assume that segments 1101 and 1102 are two different segments and segment 1103 is identified to be the same as segment 1102. If segments 1101 and 1102 are chosen as representative segments, then their rectangular effective areas 1104 and 1105 (i.e. those areas which could require subsequent OPC updates) overlap in an area 1107. Therefore, the actual affected area is equal to the sum of areas 1104 and 1105 minus area 1107. On the other hand, if segment 1103 is chosen as a representative segment (and not segment 1102), then the affected area is equal to the sum of areas 1104 and 1106 (i.e. no overlap occurs). Therefore, clustering the representative segments can advantageously minimize the processing area. Reducing processing area means fewer features will be included in the area, thereby reducing the total segments involved in the layout update.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, some embodiment of the invention can include a method of manufacturing an integrated circuit. The method can include the steps described in reference to FIGS. 6A, 6B, and 6C, as well as the steps of generating a binary mask based on the updated layout and exposing a wafer to electromagnetic radiation using the binary mask.

In another example, some embodiments of the invention can include a system for processing a layout. The system can at least include the means for partitioning the layout into units, the means for dissecting geometric structures in a unit into segments, the means for matching a segment with a listed segment in a database if the segment and the listed segment have substantially the same environment, the means for creating a new database entry if the segment and the listed segment do not have substantially the same environment, the means for determining a processing result for a representative segment, the means for copying the processing result to any segments linked to the representative segment, and the means for updating the layout with the processing results.

Note that pattern identification using segments is not limited to model-based OPC. For example, this identification method is equally applicable to rule-based OPC. Specifically, both rule-based and model-based OPC can use segments in processing, thereby facilitating segment matching. Additionally, if model-based OPC is performed on a particular layout or partitions of the layout, the database can be updated with bias values, which in turn can be reused in other layouts or other portions of the layout (assuming that repetition based on the same criteria upon which the database is built is found). This process can be characterized as equivalent to generating "rules" on the fly using model-based OPC, i.e. a hybrid OPC. In this case, each entry in the database represents a rule, the corner list is the condition of the rule, and the bias value is the result of the rule. This rule-based OPC could have somewhat slower performance than conventional rule-based OPC, but advantageously provides the same accuracy as model-based OPC.

Figure 12:
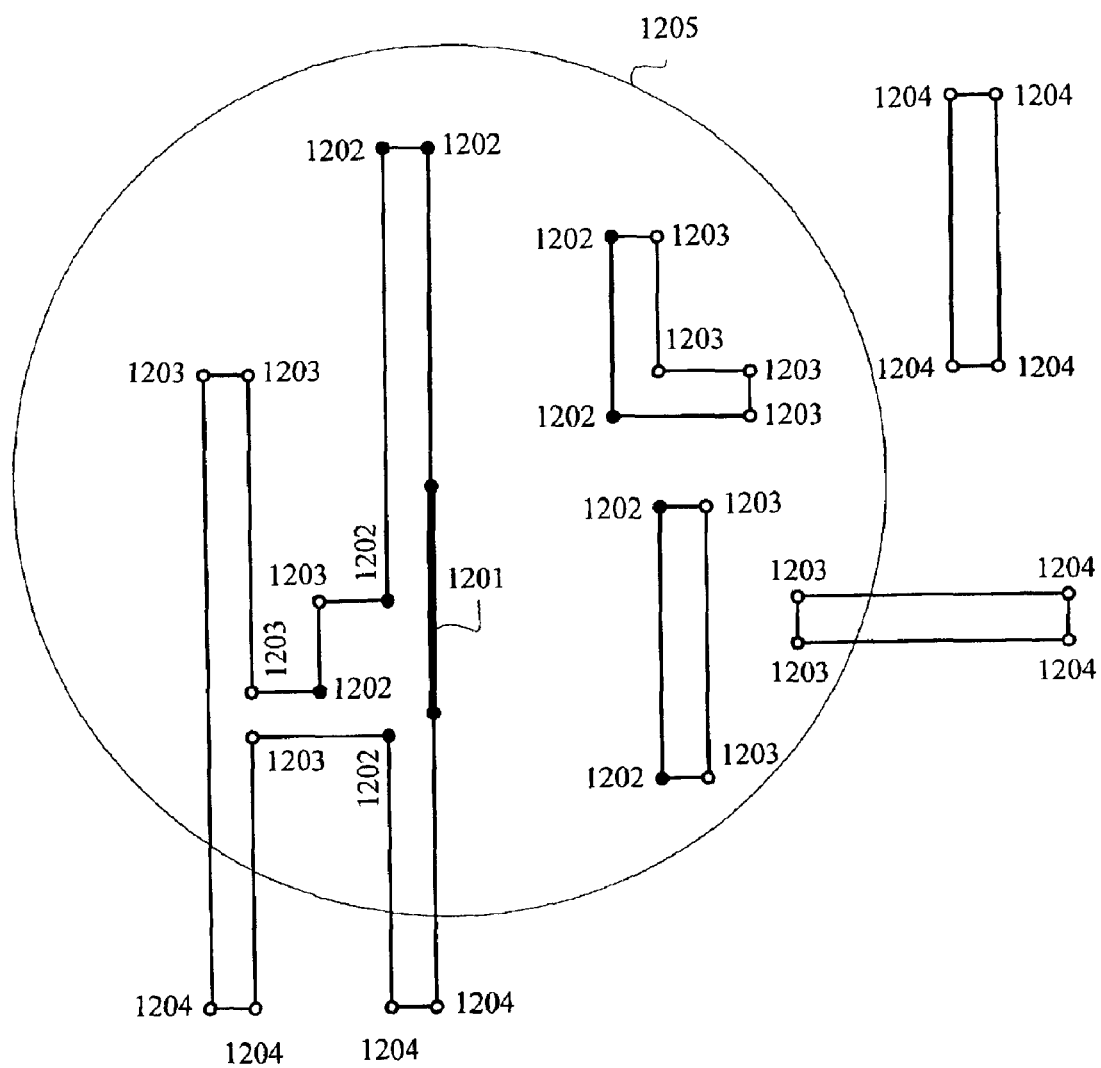
FIG. 12 illustrates an embodiment of a simplified segment matching process in which only corners immediately neighboring an edge are considered.

In one simplified embodiment of the described segment matching process illustrated in FIG. 12, only corners immediately neighboring an edge 1201 are considered, thereby reducing database size. That is, only short-range effects created by corners 1202 (represented by black dots) are considered and the longer-range effects created by corners 1203 inside effective area 1205 (represented by blank dots) as well as those corners 1204 outside effective area 1205 are ignored, thereby more closely approximating conventional rule-based OPC. Note that considering only short-range effects reduces the time spent in corner matching and therefore can significantly improve performance. In yet another simplified embodiment, the width and space information for each segment can be considered (which is already used for width-space based rule-OPC) for segment matching instead of corners. In this embodiment, two segments are equivalent if their relative width and space information is the same. This most similarly resembles width-space based rule-OPC.

The system and methods described herein can be applied to any lithographic process technology, including ultraviolet, deep ultraviolet (DUV), extreme ultraviolet (EUV), x-ray, electron projection lithography (EPL), and ebeam. Accordingly, it is intended that the scope of the invention be defined by the following claims and their equivalents.

What is claimed is:

1. A method of reducing processing time for a layout, the method comprising:
receiving a segment of the layout for analysis;
accessing an environment of the segment;
determining if another segment having a substantially identical environment has previously been processed;
if so, then re-using a processing result of the other segment for the segment; and
otherwise, calculating a processing result of the segment and storing the processing result, wherein the substantially identical environment refers to a similar segment length and a similar corner environment.

2. The method of claim 1, wherein determining includes accessing previously processed representative segments.

3. A method of reducing processing time for a layout, the method comprising:
receiving a segment of the layout for analysis;
accessing an environment of the segment;
determining if another segment having a substantially identical environment has previously been processed;
if so, then re-using a processing result of the other segment for the segment; and
otherwise, calculating a processing result of the segment and storing the processing result,
wherein the substantially identical environment refers to a similar segment length, a similar corner environment, and a similar orientation with respect to axes of symmetry under non-radially symmetric illumination conditions.

4. A method of reducing processing time for a layout, the method comprising:
receiving a segment of the layout for analysis;
accessing an environment of the segment;
determining if another segment having a substantially identical environment has previously been processed;
if so, then re-using a processing result of the other segment for the segment; and
otherwise, calculating a processing result of the segment and storing the processing result,
wherein the substantially identical environment refers to a similar segment length and a similar corner environment, and wherein accessing an environment includes using an effective area surrounding the segment.

5. A method of reducing processing time for a layout, the method comprising:
receiving a segment of the layout for analysis;
accessing an environment of the segment;
determining if another segment having a substantially identical environment has previously been processed;
if so, then re-using a processing result of the other segment for the segment;
otherwise, calculating a processing result of the segment and storing the processing result; and
clustering representative segments in the layout.

6. A method of reducing processing time for a layout, the method comprising:
receiving a segment of the layout for analysis;
accessing an environment of the segment;
determining if another segment having a substantially identical environment has previously been processed;
if so, then re-using a processing result of the other segment for the segment; and
otherwise, calculating a processing result of the segment and storing the processing result,
wherein the substantially identical environment refers to a similar segment length and a similar corner environment, and, wherein determining includes accessing at least one of a database and a look-up table.

7. The method of claim 6, wherein the database is saved as a rule set for rule-based OPC of future layouts.

8. A method of reducing processing time for a layout, the method comprising:
receiving a segment of the layout for analysis;
accessing an environment of the segment;
determining if another segment having a substantially identical environment has previously been processed;
if so, then re-using a processing result of the other segment for the segment; and
otherwise, calculating a processing result of the segment and storing the processing result, wherein determining includes considering the illumination of a mask implementing the layout.

9. The method of claim 8, wherein determining includes considering the orientation of the segment and the other segment.

10. A method of reducing optical proximity correction (OPC) processing time, the method comprising:
receiving layout data;
partitioning the layout data into units;
for each unit, dissecting geometric structures in the unit into segments;
for each segment, attempting to match the segment to a listed segment in a database,
wherein if the segment matches a listed segment, then linking the segment to the listed segment in the database, and
wherein if the segment does not match a listed segment, then creating a database entry;
for each database entry, determining an OPC bias for a representative segment and copying the OPC bias to any segments linked to the representative segment; and updating the layout data with the biases.

11. The method of claim 10, further including for each database entry and before determining the OPC bias for the representative segment, performing an intermediate update to the layout data based on any existing OPC biases.

12. The method of claim 10, wherein attempting to match the segment to a listed segment includes comparing a first environment of the segment to a second environment of the listed segment.

13. The method of claim 12, wherein the first environment is determined by any corners within an effective area of the segment and the second environment is determined by any corners within the effective area of the listed segment.

14. The method of claim 12, wherein any environment is determined by any segments within an effective area of the segment.

15. The method of claim 12, wherein any environment is determined by any corner immediately neighboring the segment.

16. The method of claim 12, wherein any environment is determined by width and space information of the segment.

17. The method of claim 12, wherein attempting to match the segment to a listed segment further includes sorting corners using a sortable representation.

18. The method of claim 17, wherein the sortable representation includes a vector set, the vector set including a relative position of each corner and at least one angle associated with each corner.

19. A method of organizing layout data for processing or verification, the method comprising:
partitioning the layout data into units;
for each unit, dissecting shapes in the unit into segments;
for each segment, attempting to match the segment to a listed segment in a database,
wherein if the segment matches a listed segment, then linking the segment to the listed segment in the database, and
wherein if the segment does not match a listed segment, then creating a database entry,
wherein attempting to match the segment to a listed segment includes comparing a first environment of the segment to a second environment of the listed segment, and
wherein the first environment is determined by any corners within an effective area of the segment and the second environment is determined by any corners within the effective area of the listed segment.

20. The method of claim 19, wherein attempting to match the segment to a listed segment further includes sorting corners using a sortable representation.

21. The method of claim 20, wherein the sortable representation includes a vector set, the vector set including a relative position of each corner and at least one angle associated with each corner.

22. A method of analyzing a layout for at least one of processing and verification, the method comprising:
receiving data for the layout;
partitioning the data into units;
for each unit, identifying polygons therein; for each polygon, attempting to match the polygon with listed polygons in a polygon database,
wherein if the polygon matches a listed polygon, then linking the polygon to the listed polygon in the database, and
wherein if the polygon does not match a listed polygon, then creating a database entry;
for each non-repeating polygon, identifying polygon edges;
for each polygon edge, attempting to match the polygon edge with listed polygon edges in an edge database,
wherein if the polygon edge matches a listed polygon edge, then linking the polygon edge to the listed polygon edge in the database, and
wherein if the polygon edge does not match a listed polygon edge, then creating a database entry;
for each non-repeating polygon edge, identifying half-edges;
for each half-edge, attempting to match the half-edge with listed half-edges in a half-edge database,
wherein if the half-edge matches a listed half-edge, then linking the half-edge to the listed half-edge in the database, and
wherein if the half-edge does not match a listed half-edge, then creating a database entry.

23. The method of claim 22, further including:
for each non-repeating half-edge, dissecting the half-edge into segments;
for each segment, attempting to match the segment to a listed segment in the database,
wherein if the segment matches a listed segment, then linking the segment to the listed segment in the database, and
wherein if the segment does not match a listed segment, then creating a database entry.

24. A system for processing a layout, the layout including a plurality of shapes, the system comprising:
means for partitioning the layout into units;
means for dissecting geometric structures in a unit into segments;
means for matching a segment with a listed segment in a database if the segment and the listed segment have substantially the same environment;
means for creating a new database entry if the segment and the listed segment do not have substantially the same environment;
means for determining an OPC bias for a representative segment;
means for copying the OPC bias to any segments linked to the representative segment; and
means for updating the layout with the biases.

25. A method of manufacturing an integrated circuit comprising:
receiving an original layout for the integrated circuit;
partitioning a plurality of shapes in the original layout into a plurality of units;
dissecting any shapes in a unit into segments;
matching a segment with a listed segment in a database if the segment and the listed segment have substantially the same environment;
creating a new database entry if the segment and the listed segment do not have substantially the same environment;
determining an optical proximity correction (OPC) bias for any representative segment;
copying the OPC bias to any segments linked to the representative segment;
updating the original layout with the OPC biases;
generating a binary mask based on the updated layout; and
exposing a wafer to electromagnetic radiation using the binary mask.

26. The method of claim 25, wherein the environment is determined by any corners within an effective area of each segment.

27. The method of claim 26, the effective area includes a circle centered on an evaluation point on the segment.

28. The method of claim 26, wherein the effective area includes a rectangle having a perimeter substantially equally distanced from the segment.

29. The method of claim 26, wherein the effective area includes a perimeter defined by an overlap of a first circle centered on an evaluation point on the segment and at least a second circle centered on an additional point for evaluating light intensity affecting the segment.

30. The method of claim 25, wherein the environment is determined by any other segments within an effective area of each segment.

31. The method of claim 25, wherein the environment is determined by any corners immediately neighboring the segment.

32. The method of claim 25, wherein the environment is determined by any other segments immediately neighboring the segment.

* * * * *